(12) United States Patent
Nakasako

(10) Patent No.: US 6,412,522 B1
(45) Date of Patent: Jul. 2, 2002

(54) BENDING DIE AND BENDING MACHINE USING THE SAME

(75) Inventor: Koji Nakasako, Miyazaki (JP)

(73) Assignee: Oki Electric Industry CO, Ltd., Tokyo (JP)

(*) Notice: Subject to any disclaimer, the term of this patent is extended or adjusted under 35 U.S.C. 154(b) by 0 days.

(21) Appl. No.: 09/617,838

(22) Filed: Jul. 17, 2000

(30) Foreign Application Priority Data

Feb. 8, 2000 (JP) .................................. 2000-029917

(51) Int. Cl.⁷ .................................................. B21F 1/00
(52) U.S. Cl. ............................................... 140/105
(58) Field of Search .................................. 140/105

(56) References Cited

U.S. PATENT DOCUMENTS 5,832,963 A * 11/1998 Hornisch .................. 140/105

* cited by examiner

*Primary Examiner*—Lowell A. Larson
(74) *Attorney, Agent, or Firm*—Rabin & Berdo, P.C.

(57) ABSTRACT

A bending die includes a base member (1, 11) and a roller (3, 14). The base member (1, 11) is provided with a first portion (1a, 11a), the root of a lead (5, 16) is in contact with, and a second portion (1b, 11b), the end (5A, 16A) of the lead (5, 16) is in contact with. The roller (3, 14) is arranged around the second portion (1b, 11b) of the base member (1, 11) to make rolling contact with the lead (5, 16) in bending operation.

16 Claims, 8 Drawing Sheets

BENDING DIE AND BENDING MACHINE USING THE SAME

CROSS REFERENCE TO RELATED APPLICATION

This application claims the priority of Application No. 2000-29917, filed Feb. 8, 2000 in Japan, the subject matter of which is incorporated herein by reference.

TECHNICAL FIELD OF THE INVENTION

The present invention relates to a bending machine for bending leads of an electric part, such as molded IC package. More particularly, the present invention relates to a bending die used for Z-bending an end portion of leads of a molded IC package, molded LSI package, etc.

BACKGROUND OF THE INVENTION

The mainstream of LSI mounting methods has been shifting from the conventional method employing DIPs (Dual In-line Packages) to the so-called surface mounting method in which a leaded electric part or device package is electrically connected to a conductor provided on the surface of a printed wiring board without using through-holes for insertion of lead wires. This shift is made to cope with an increase in the number of gates or the like as a result of the improvements of LSI chips, i.e., the achievement of high integration density, the increase in the number of functions thereof, and the achievement of high speed operation. Examples of known surface-mounted packages include resin-sealed SOJ (Small Outline "J") leaded packages and PLCCs (Plastic Leaded Chip Carriers). Leads that are used in these packages are bended in a J or L shape and therefore capable of being mounted directly on a printed wiring board (PWB).

In general, press working effects bending of lead wires of ICs. Since lead wires are extremely thin, they are weak or fragile and it is therefore necessary to use extreme care in bending them.

A conventional bending machine includes a bending die and a punch. The bending die is provided with an outer surface, which is flattened and coated with a hard material. A lead of an IC or LSI package is bended on and along the surface. The lead is plated with solder. The coating is made on the surface of the bending die so as to reduce friction between the lead and the surface, and therefore the amount of small pieces of solder peeled off the lead is reduced.

In operation, when the IC package is fed to the bending die, the root portion of the lead is placed on an upper surface of the bending die. Next, the punch goes down so that the lead is pressed from the root portion, thereby bending it into a substantially Z-like shape.

As described above, the lead is plated with solder or tin in order to improve the electric conductivity required when it is mounted on a printed wiring board (PWB) and to enhance the adhesion of solder used to connect the lead to the PWB.

According to the above described conventional bending machine, even if the hard coating is made on the surface of the bending die, the ends of leads are scratched due to the frictional contact with the surface while the bending process is carried out. If the plating on the lead is peeled off, the small pieces of plating would be stuck onto the bending die, and then the plating pieces might be stuck back to the leads. If a large amount of plating is peeled off, a short circuit might be made between the leads.

OBJECTS OF THE INVENTION

Accordingly, an object of the present invention is to provide a bending die in which friction contact with a lead is remarkably reduced.

Another object of the present invention is to provide a bending machine in which friction contact between a bending die and a lead is remarkably reduced.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

A bending die according to a first aspect of the present invention includes a base member (1, 11), which is provided with a first portion (1a, 11a), the root of a lead (5, 16) is in contact with, and a second portion (1b, 11b), the end (5A, 16A) of the lead (5, 16) is in contact with; and a roller (3, 14), provided around the second portion (1b, 11b) of the base member (1, 11) to make rolling contact with the lead (5, 16) in bending operation.

A bending machine according to a second aspect of the present invention includes a bending die (1, 11) which is provided with a first portion (1a, 11a), the root of a lead (5, 16) is in contact with, and a second portion (1b, 11b), the end of the lead (5, 16) is in contact with; a punch (6, 17) which is movable in a specific direction to bend the lead (5, 16); and a roller (3, 14) provided around the second portion (1b, 11b) of the bending die (1, 11) to make rolling contact with the lead (5, 16) in bending operation.

DETAILED DISCLOSURE OF THE INVENTION

In the following detailed description of the preferred embodiments, reference is made to the accompanying drawings which forma part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

For better understanding of the present invention, a conventional technology is first described.

Figure 1A:
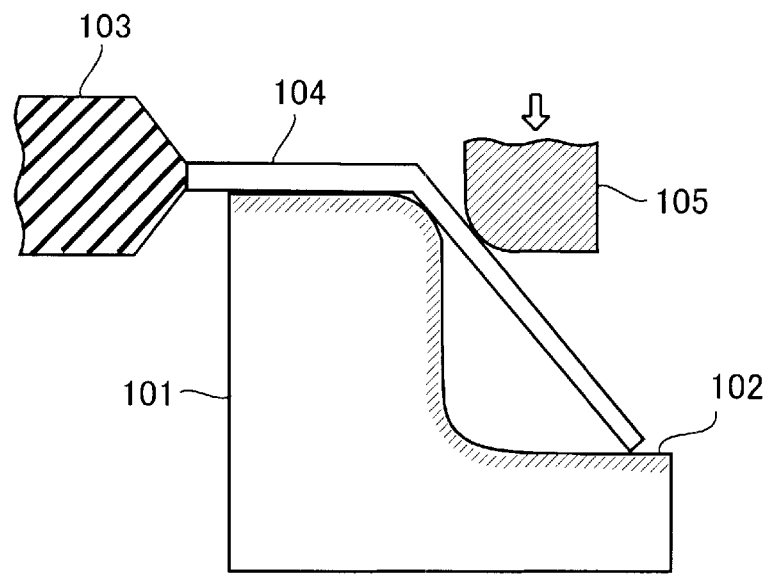
FIGS. 1A and 1B are side views showing steps of bending process using a conventional bending die.
Figure 1B:
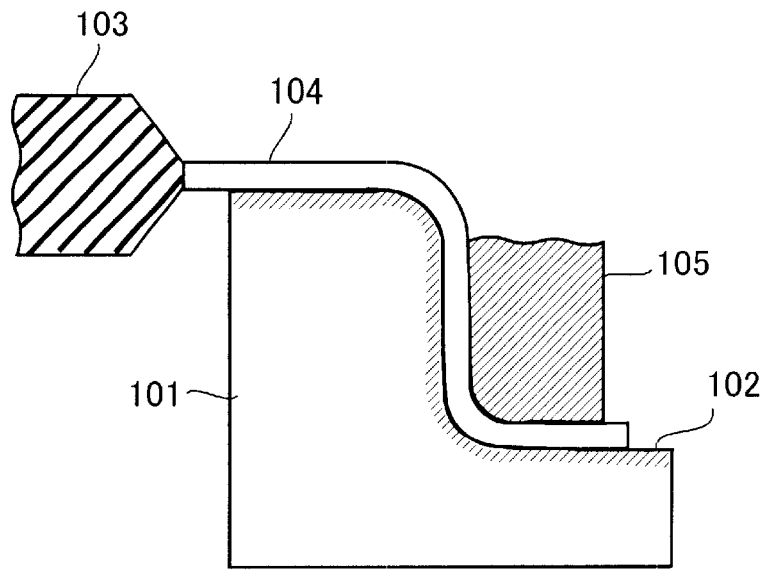

FIGS. 1A and 1B are side views showing steps of bending process using a conventional bending machine, which bends a lead 104 of a resin-molded IC package 103. The bending machine includes a bending die 101 and a punch 105. The bending die 101 is provided with a surface 102 which is flattened and coated with a hard material. The lead 104 is bended on and along the surface 102. The lead 104 is plated with solder. The coating is made on the surface 102 so as to reduce friction between the lead 104 and the surface 102, and therefore the amount of small pieces of solder peeled off the lead 104 is reduced.

In operation, the IC package 103 is fed to the bending die 101 by a robot hand or work feeder (not shown) and placed in a cavity. At this time, the root portion of the lead 104 is placed on an upper surface of the bending die 101. Next, a press machine (not shown) is driven to lower the punch 105 so that the lead 104 is pressed from the root portion, thereby bending it into a substantially Z-like shape, as shown in FIG. 1B.

As described above, the lead 104 is plated with solder or tin in order to improve the electric conductivity required when it is mounted on a printed wiring board (PWB) and to enhance the adhesion of solder used to connect the lead 104 to the PWB.

According to the above described conventional bending machine, even if the hard coating is made on the surface 102 of the bending die 101, the ends of leads 104 are scratched due to the frictional contact with the surface 102 while the bending process is carried out. If the plating on the lead 104 is peeled off, the small pieces of plating would be stuck onto the bending die 101, and then the plating pieces might be stuck back to the leads 104. If a large amount of plating is peeled off, a short circuit might be made between the leads 104.

Figure 2A:
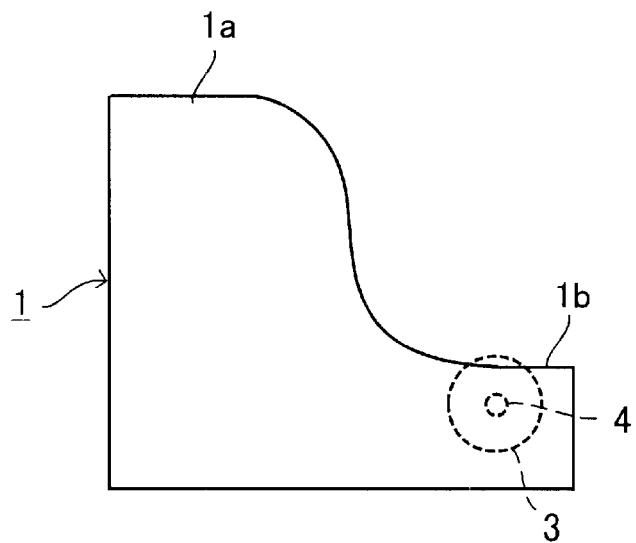
FIG. 2A is a side view showing a bending die according to a first preferred embodiment of the present invention.
Figure 2B:
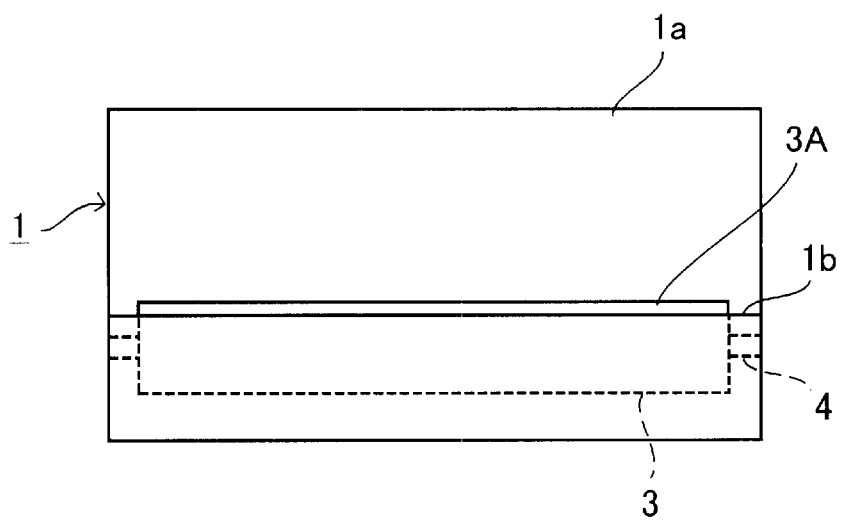
FIG. 2B is a front view showing the bending die according to the first preferred embodiment of the present invention.
Figure 3:
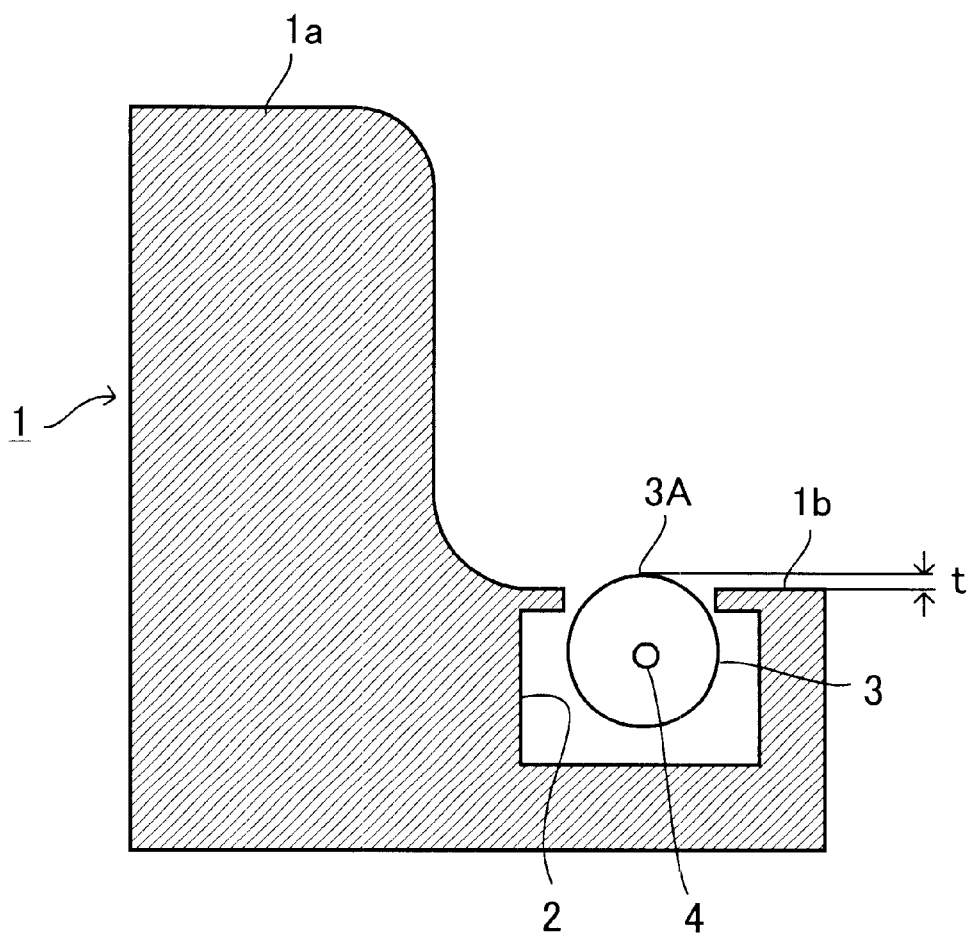
FIG. 3 is a cross-sectional view showing the bending die according to the first preferred embodiment of the present invention.

FIGS. 2A and 2B are side and front views showing a bending die according to a first preferred embodiment of the present invention. FIG. 3 is a cross-sectional view showing the bending die, shown in FIGS. 2A and 2B. FIGS. 4A–4D are side views showing steps of bending process using a bending machine with the bending die, shown in FIGS. 2A, 2B and 3.

Figure 4A:
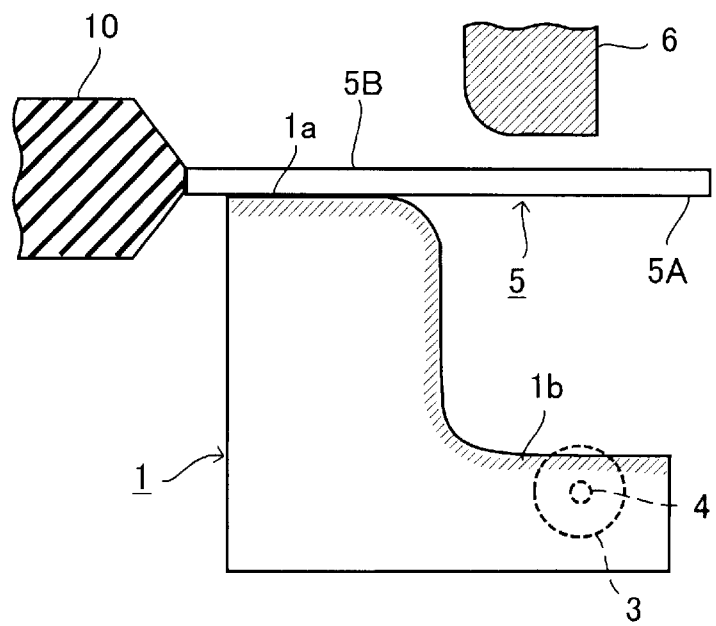
FIGS. 4A–4D are side views showing steps of bending process using a bending machine with the bending die, shown in FIGS. 2A, 2B and 3.

The bending machine is used for bending an outer lead 5 of a resin-molded IC package 10 as shown in FIG. 4A. The bending machine includes a bending die (base member) 1, a punch 6 and a roller 3. The bending die 1 is provided with an upper surface 1a, a lower surface 1b and a side surface, extending between the upper and lower surfaces 1a and 1b. The surfaces are flattened. The outer lead 5 is bended on and along the surfaces. The outer lead 5 is plated with solder.

The bending die 1 is provided with a hollow 2 in which the roller 3 is arranged so that the roller 3 rotates about an axis 4 therein. The axis 4 is arranged so that the roller 3 is partially projected upwardly in radiating direction from the lower surface 1b to have a difference of "t" in level between a top 3A of the roller and lower surface 1b. The roller 3 is shaped cylindrical. The roller 3 is partially exposed and is projected in the radiating direction from the lower surface 1b of the bending die 1.

In operation, the IC package 10 is fed to the bending die 1 by a robot hand or work feeder (not shown) and placed in a cavity. At this time, a root portion 5B of the outer lead 5 is placed on the upper surface 1a of the bending die 1, as shown in FIG. 4A. The punch 6 is positioned above an end portion 5A of the outer lead 5.

Figure 4B:
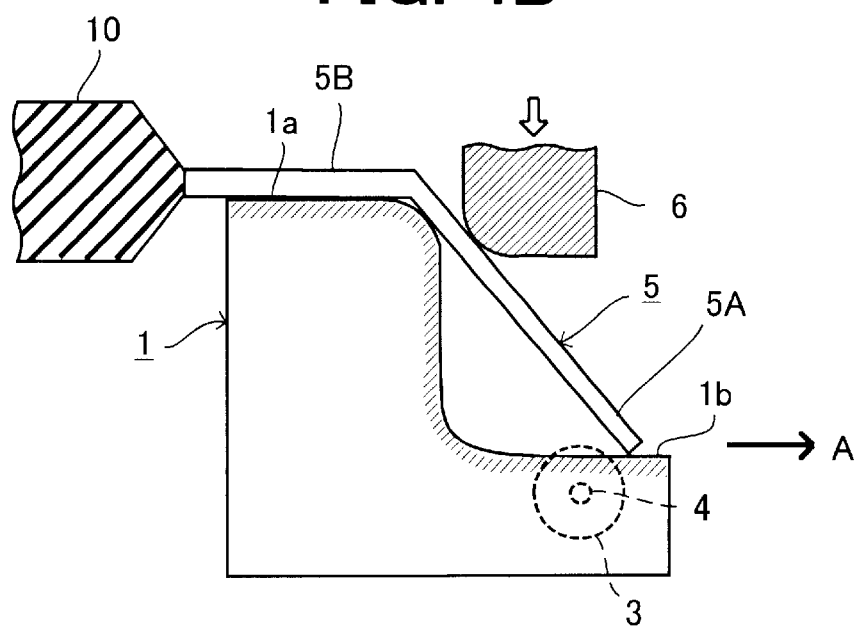
Figure 4C:
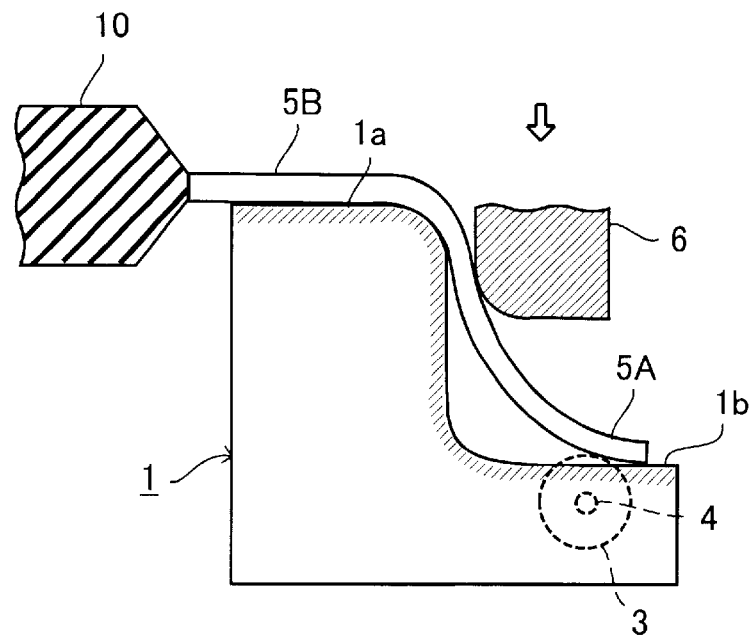

Next, a press machine (not shown) is driven to lower the punch 6 so that the outer lead 5 is pressed from the root portion, as shown in FIG. 4B. Then, the end 5A of the outer lead 5 gets being contact with the roller 3, while the outer lead 5 is pulled in a horizontal direction "A", as shown in FIG. 4C.

Figure 4D:
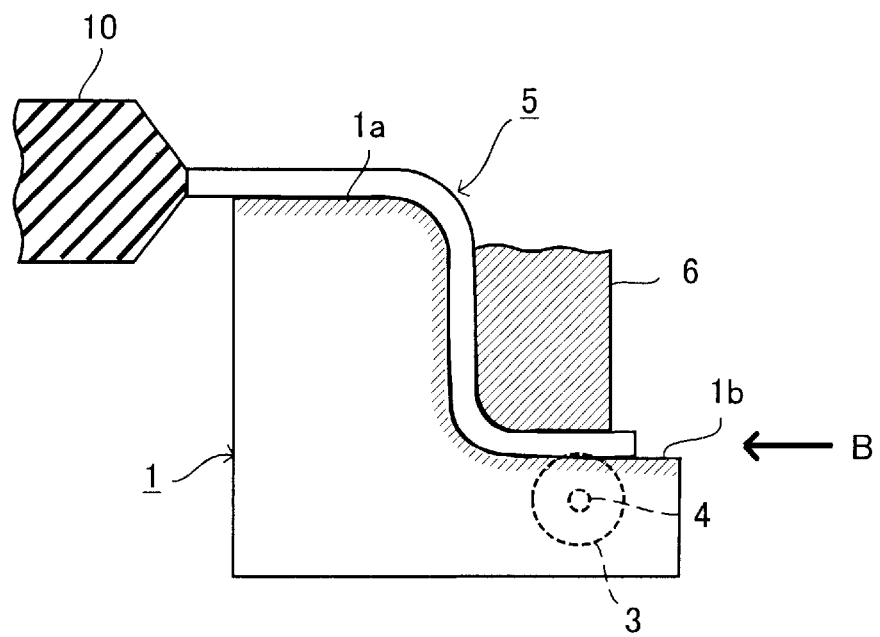

When the punch 6 further goes down, the outer lead 5 is bended and formed into a substantially Z-like shape along the surface of the bending die 1, as shown in FIG. 4D. In this step, the roller 3 rotates counterclockwise to make a rolling contact with the outer lead 5. In other words, a contact point X (3A) of the roller 3 keeps being in contact with the end 5A of the outer lead 5 while the outer lead 5 is bended. Therefore, the end 5A of the outer lead 5 moves in a horizontal direction "B" while being contact with the roller 3.

As described above, according to the first preferred embodiment of the present invention, the roller 3 rotates while the out lead 5 is bended to make a rolling contact with the end 5A of the lead 5, so that the outer lead 5 is not scratched due to the frictional contact with the lower surface 1b. As a result, the solder plating on the outer lead 5 is prevented from being peeled off; and therefore, it is prevented that the small pieces of plating are stuck onto the bending die 1.

Figure 5A:
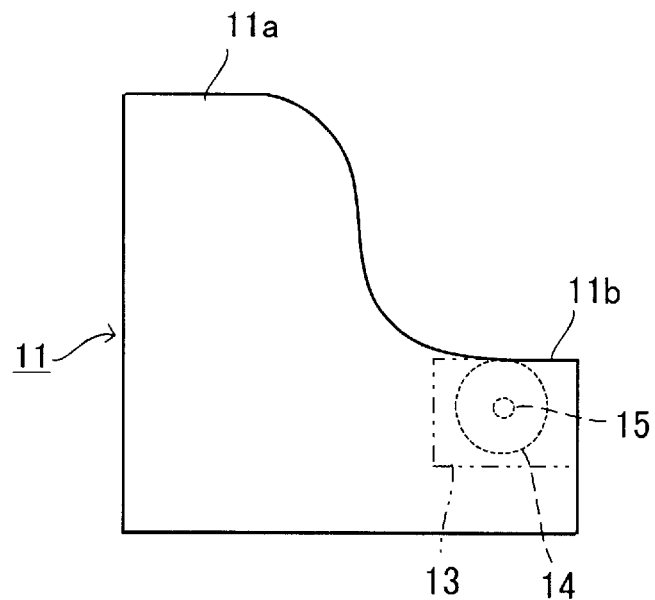
FIG. 5A is a side view showing a bending die according to a second preferred embodiment of the present invention.
Figure 5B:
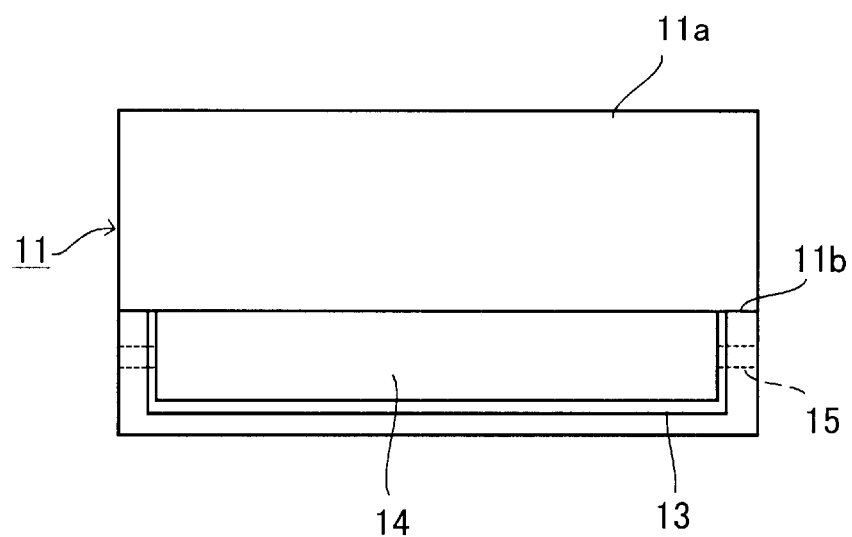
FIG. 5B is a front view showing the bending die according to the second preferred embodiment of the present invention.
Figure 6:
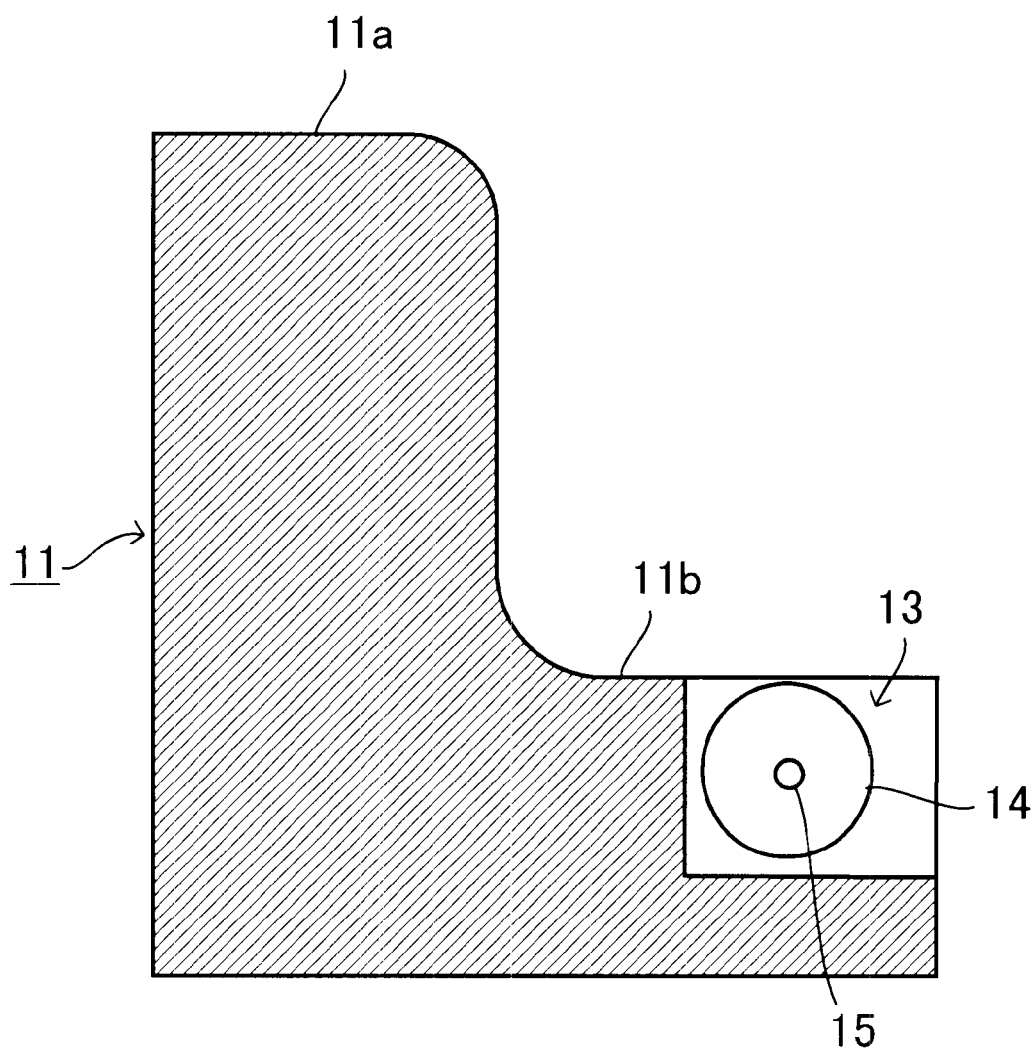
FIG. 6 is a cross-sectional view showing the bending die according to the second preferred embodiment of the present invention.
Figure 7A:
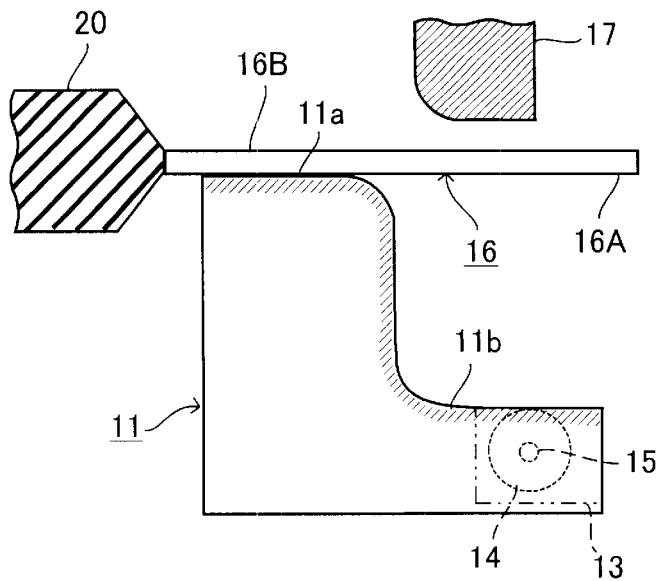
FIGS. 7A–7C are side views showing steps of bending process using a bending machine with the bending die, shown in FIGS. 5A, 5B and 6.
Figure 7B:
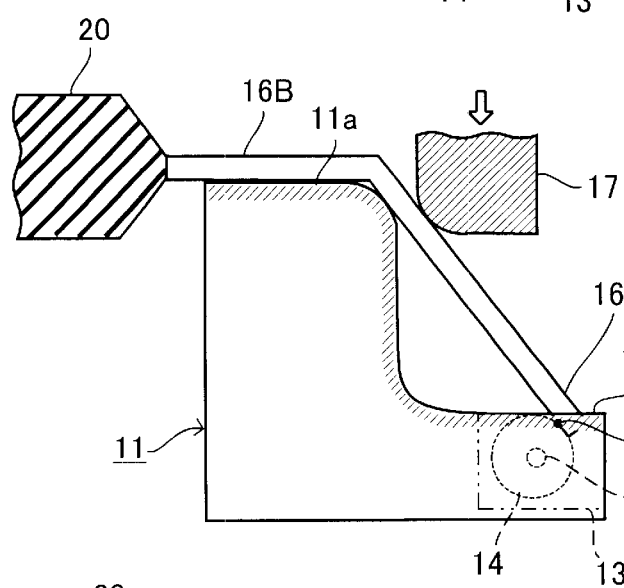
Figure 7C:
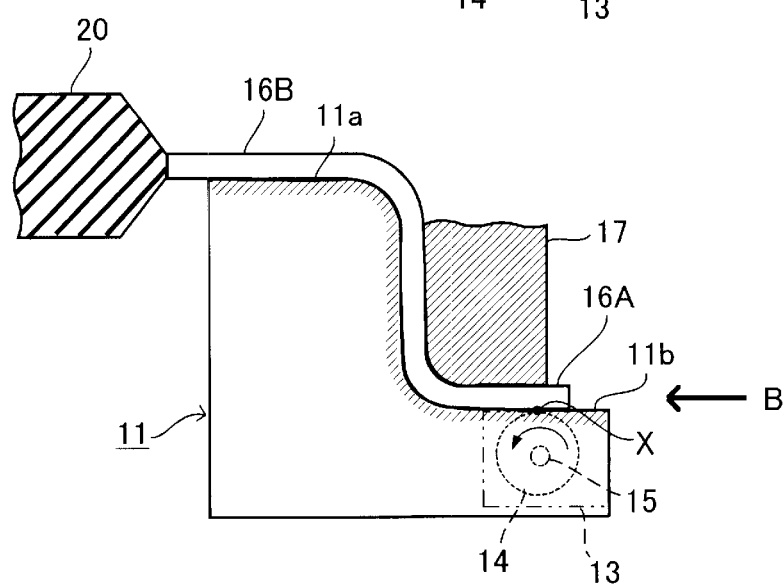

FIGS. 5A and 5B are side and front views showing a bending die according to a second preferred embodiment of the present invention. FIG. 6 is a cross-sectional view showing the bending die, shown in FIGS. 5A and 5B. FIGS. 7A–7C are side views showing steps of bending process using a bending machine with the bending die, shown in FIGS. 5A, 5B and 6.

The bending machine is used for bending an outer lead 16 of a resin-molded IC package 20 as shown in FIG. 7A. The bending machine includes a bending die (base member) 11, a punch 17 and a roller 14. The bending die 11 is provided with an upper surface 11a, a lower surface 11b and a side surface, extending between the upper and lower surfaces 11a and 11b. The surfaces are flattened. The outer lead 16 is bended on and along the surfaces of the bending die 11. The outer lead 16 is plated with solder.

The bending die 11 is provided with a hollow or opening 13 in which the roller 14 is arranged so that the roller 14 rotates about an axis 15 therein. The axis 15 is arranged so that the roller 14 is completely contained in the hollow 13 under the lower surface 11a of the bending die 11. The roller 14 is shaped cylindrical. The roller 14 is exposed for the most part so that the end 16A of the outer lead 16 is in contact with the roller 14 at the beginning of the bending operation.

In operation, the IC package 20 is fed to the bending die 11 by a robot hand or work feeder (not shown) and placed in a cavity. At this time, a root portion 16B of the outer lead 16 is placed on the upper surface 11a of the bending die 11, as shown in FIG. 7A. The punch 17 is positioned above an end portion 16A of the outer lead 16.

Next, a press machine (not shown) is driven to lower the punch 17 so that the outer lead 16 is pressed from the root portion 16B, as shown in FIG. 7B. Then, the end 16A of the outer lead 16 gets being contact with the roller 14, while the outer lead 16 is pulled in a horizontal direction "A", as shown in FIG. 7B.

When the punch 17 further goes down, the outer lead 16 is bended and formed into a substantially Z-like shape along the surface of the bending die 11, as shown in FIG. 7C. In this step, the roller 14 rotates counterclockwise to make a rolling contact with the outer lead 16. In other words, a contact point X of the roller 14 keeps being in contact with the end 16A of the outer lead 16 while the outer lead 16 is bended. Therefore, the end 16A of the outer lead 16 moves in a horizontal direction "B" while being contact with the roller 14.

As described above, according to the second preferred embodiment of the present invention, the roller 14 rotates while the out lead 16 is bended to make a rolling contact with the end 16A of the lead 16, so that the outer lead 16 is not scratched due to the frictional contact with the lower surface 11b. As a result, the solder plating on the outer lead 16 is prevented from being peeled off; and therefore, it is prevented that the small pieces of plating are stuck onto the bending die 11. In addition, the end 16A of the outer lead 16 is always in contact with the roller 14 without friction while the outer lead 16 is bended. Therefore, a larger area of the outer lead 16 is prevented from being abraded or scratched.

What is claimed is:

1. A bending die used together with a punch for bending a lead of an electric part during a bending operation, the lead being provided with a root adjacent the electric part and an end, comprising:

a base member, which is provided with a first portion, the root of the lead being in contact with the first portion during the bending operation, and a second portion, the second portion being disposed at a lower level than the first portion; and a roller provided in the second portion of the base member to make rolling contact with the lead during at least part of the bending operation, wherein the second portion of the base member is provided with an upper surface and a hollow in which the roller is completely contained, the roller being disposed under the upper surface of the second portion and being exposed so that the end of the lead is in contact with the roller at the beginning of the bending operation.

2. A bending die according to claim 1, wherein the electric part is a resin-molded IC package.

3. A bending die according to claim 1, wherein the first portion of the base member is provided with an upper surface, the root of the lead being in contact with the upper surface of the first portion during the bending operation, and a side surface extending between the upper surface of the first portion and the upper surface of the second portion.

4. A bending die according to claim 3, wherein the punch is movable in a vertical direction to bend the lead into a Z-shape along the upper surface of the first portion, the side surface, and the outer surface of the roller.

5. A bending die according to claim 3, wherein the roller makes rolling contact with the end of the lead during at least part of the bending operation to reduce friction between the lead and the base member.

6. A bending die according to claim 3, wherein the roller is exposed for the most part.

7. A bending die used together with a punch for bending a lead of a resin-molded IC package during a bending operation, the lead being provided with a root adjacent the IC package and an end, comprising:

a base member which is provided with an upper surface, the root of the lead being in contact with the upper surface during the bending operation, a lower surface, the end of the lead being in contact with the lower surface during at least part of the bending operation, and a side surface extending between the upper surface and lower surface; and a roller which is provided under the lower surface of the base member to make rolling contact with the end of the lead during at least part of the bending operation to reduce friction between the lead and base member, wherein the punch is moved in a vertical direction to bend the lead into a Z-shape along the upper surface, side surface and lower surface of the base member, and wherein the base member is provided with a hollow in which the roller is completely contained, the roller being disposed under the lower surface of the base member and being exposed so that the end of the lead is in contact with the roller at the beginning of the bending operation.

8. A bending die according to claim 7, wherein the roller is exposed for the most part.

9. A bending machine for bending a lead of an electric part during a bending operation, the lead being provided with a root adjacent the electric part and an end, comprising:

a bending die which is provided with a first portion, the root of the lead being in contact with the first portion during the bending operation, and a second portion, the second portion being disposed at a lower level than the first portion;

a punch which is movable in a specific direction to bend the lead during the bending operation; and a roller provided in the second portion of the bending die to make rolling contact with the lead during at least part of the bending operation, wherein the second portion of the bending die is provided with an upper surface and a hollow in which the roller is completely contained, the roller being disposed under the upper surface of the second portion and being exposed so that the end of the lead is in contact with the roller at the beginning of the bending operation.

10. A bending machine according to claim 9, wherein the electric part is a resin-molded IC package.

11. A bending machine according to claim 9, wherein the first portion of the bending die is provided with an upper surface, the root of the lead being in contact with the upper surface of the first portion during the bending operation, and a side surface extending between the upper surface of the first portion and the upper surface of the second portion.

12. A bending machine according to claim 11, wherein the punch is movable in a vertical direction to bend the lead into a Z-shape along the upper surface of the first portion, the side surface and the outer surface of the roller.

13. A bending machine according to claim 11, wherein the roller makes rolling contact with the end of the lead during at least part of the bending operation to reduce friction between the lead and the bending die.

14. A bending machine according to claim 11, wherein the roller is exposed for the most part.

15. A bending machine used for bending a lead of a resin-molded IC package during a bending operation, the lead being provided with a root adjacent the IC package and an end, comprising:

a bending die which is provided with an upper surface, the root of the lead being in contact with the upper surface during the bending operation, a lower surface, the end of the lead being in contact with the lower surface during at least part of the bending operation, and a side surface extending between the upper surface and lower surface;

a punch which is movable in a vertical direction to bend the lead into a Z-shape along the upper surface, side surface and lower surface of the bending die; and a roller which is provided under the lower surface of the bending die to make rolling contact with the end of the lead during at least part of the bending operation to reduce friction between the lead and bending die, wherein the bending die is provided with a hollow in which the roller is completely contained, the roller being disposed under the lower surface of the bending die and being exposed so that the end of the lead is in contact with the roller at the beginning of the bending operation.

16. A bending machine according to claim 15, wherein the roller is exposed for the most part.

\* \* \* \* \*